United States Patent
Yuth

[19]

[11] Patent Number: 5,883,446
[45] Date of Patent: Mar. 16, 1999

[54] SYSTEM FOR SWITCHING BETWEEN STAND-BY AND WAKE-UP STATES, OF AN INFORMATION PROCESSING UNIT AND OF AN ANALOGUE SWITCH

[75] Inventor: Loth Siri Yuth, Saint Brice Sous Foret, France

[73] Assignees: Automobiles Peugeot, Paris; Automobiles Citroen, Neuilly-sur Seine, both of France

[21] Appl. No.: 884,384
[22] Filed: Jun. 27, 1997

[30] Foreign Application Priority Data

Jun. 28, 1996 [FR] France .................................. 98 08123

[51] Int. Cl.[6] .............................. H01H 35/00; G06F 1/00
[52] U.S. Cl. .................... 307/130; 364/707; 395/750.01; 395/750.03; 307/125
[58] Field of Search ..................................... 307/112, 113, 307/116, 125, 130, 139, 140; 364/707; 395/750.01, 750.02, 750.03, 750.04, 750.05, 750.06, 750.07, 750.08

[56] References Cited

U.S. PATENT DOCUMENTS

| | | |
|---|---|---|
| 5,198,697 | 3/1993 | Loth . |
| 5,214,785 | 5/1993 | Fairweather ............................. 395/887 |
| 5,237,698 | 8/1993 | Ohmae ................................ 395/750.05 |
| 5,481,732 | 1/1996 | Shahbazi ............................ 395/750.05 |
| 5,579,252 | 11/1996 | Huang .................................... 364/707 |
| 5,664,203 | 9/1997 | Hong et al. ......................... 395/750.05 |

FOREIGN PATENT DOCUMENTS 0 461 432 A   12/1991   European Pat. Off. .

OTHER PUBLICATIONS

Electronique, No. 15, 1 Feb. 1992, Paris, p. 23, 25 XP000331790, "Un amplificateur a deux états de fonctionnement."

Electronics, vol. 48, No. 25, 11 Dec. 1975, New York, US, p. 107 XP002027610; SMIT: "Sensing resistor limits power–supply current."

*Primary Examiner*—Jeffrey Gaffin
*Assistant Examiner*—Jonathan S. Kaphan
*Attorney, Agent, or Firm*—Burns, Doane, Swecker & Mathis, L.L.P.

[57] ABSTRACT

In this system including a switching device (21) interposed between an information processing unit (22) and an analogue switch (23), in which the unit includes an analogue information input (24) and a wake-up information input (25) originating from an output of the switch, the unit includes a stand-by/wake-up state control output (27) for the device, and this device includes a switch facility (28) openable by the state control output, and which is interposed between the output of the switch and a comparator (29) adapted so as to compare the output from the switch with a reference level so as to deliver a corresponding command at the wake-up information input, and a switch facility (30) closeable by the state control output, and which is interposed between the output of the switch and the analogue information input (24).

4 Claims, 3 Drawing Sheets

SYSTEM FOR SWITCHING BETWEEN STAND-BY AND WAKE-UP STATES, OF AN INFORMATION PROCESSING UNIT AND OF AN ANALOGUE SWITCH

The present invention relates to a system for switching between stand-by and wake-up states, including a switching device interposed between an information processing unit and at least one analogue switch with voltage levels.

A certain number of switching systems of this type are already known in the state of the art, in which the information processing unit includes an analogue information input and a wake-up information input originating from an analogue switch.

Such an analogue switch includes, for example, a certain number of circuits in parallel, each furnished with a resistor of specified value and with a breaker, and interposed between the analogue input of the processing unit and earth, so that when a user for example actuates one of the breakers, the switch delivers an analogue voltage level at its output corresponding to the state of actuation or nonactuation of one or more breakers. This analogue voltage is then forwarded to the information processing unit by way of the switching device, this enabling this unit to process the corresponding information, that is to say to determine, for example, the state of actuation of the breakers of the switch.

In the state of the art, the wake-up information input of the information processing unit is linked to the switch, and more particularly to the midpoint between a resistor and a breaker of a circuit of the latter, through a diode, and this switch includes a fault detection resistor connected between its analogue output and earth.

This wake-up information input of the information processing unit is also linked to a permanent voltage source through a resistor, whilst the analogue information input of the latter is linked to a voltage source controllable by this unit, through a resistor and a diode.

In the stand-by state, the information processing unit cuts off the controllable supply source associated with its analogue information input and monitors the state of its wake-up information input.

Thus, the latter is linked on the one hand to a permanent voltage source and on the other hand to the switch.

In the stand-by state, that is to say so long as no action is exercised at switch level, the wake-up information input of the information processing unit is at the logic 1 level.

The controllable voltage source joined to the analogue information input of the unit is then cut off.

Following an action at the level of the switch, for example by closing one of its breakers, the wake-up information input of the information processing unit is earthed by virtue of this actuation of the breaker, thus making it possible to toggle the wake-up information input of the information processing unit between a logic 1 level and a logic 0 level.

The central unit then detects this change of state and wakes up the device so as to transfer it to a wake-up state, in which it triggers the operation of the controllable voltage source linked to its analogue information input so as to allow the forwarding of information between the switch and this analogue information input of the information processing unit so that the latter is analysed.

However, it is appreciated that this structure has a certain number of drawbacks since, in the standby state, a relatively large current still flows between the information processing unit and more particularly the voltage source joined to its wake-up information input and the switch owing to the presence of the fault detection resistor linked to earth.

Moreover, this voltage is also applied to the analogue information input of the information processing unit, thus presenting a certain degree of risk of impairment thereof.

The purpose of the invention is therefore to solve these problems.

To this end, the subject of the invention is a system for switching between stand-by and wake-up states, including a switching device interposed between an information processing unit and at least one analogue switch with voltage levels, in which the information processing unit includes an analogue information input and a wake-up information input originating from an analogue output of the analogue switch, wherein the information processing unit furthermore includes a stand-by/wake-up state control output for the device, this device including a first semiconductor switch facility openable by the state control output of the central unit, and which is interposed between the analogue output of the switch and a voltage comparator adapted for comparing the analogue output signal from the switch with a reference level so as to deliver a corresponding command at the wake-up information input of the central unit, and a second semiconductor switch facility closeable by the state control output of the central unit, and which is interposed between the analogue output of the analogue switch and the analogue information input of the central unit.

Advantageously, the analogue switch includes a fault detection resistor, one terminal of which is joined to the analogue output of this analogue switch and another terminal of which is adapted so as to be linked to earth through a third semiconductor switch facility, closeable by the state control output of the central unit.

The invention will be better understood on reading the description which follows, given merely by way of example and with reference to the appended drawings in which.

Figure 1:
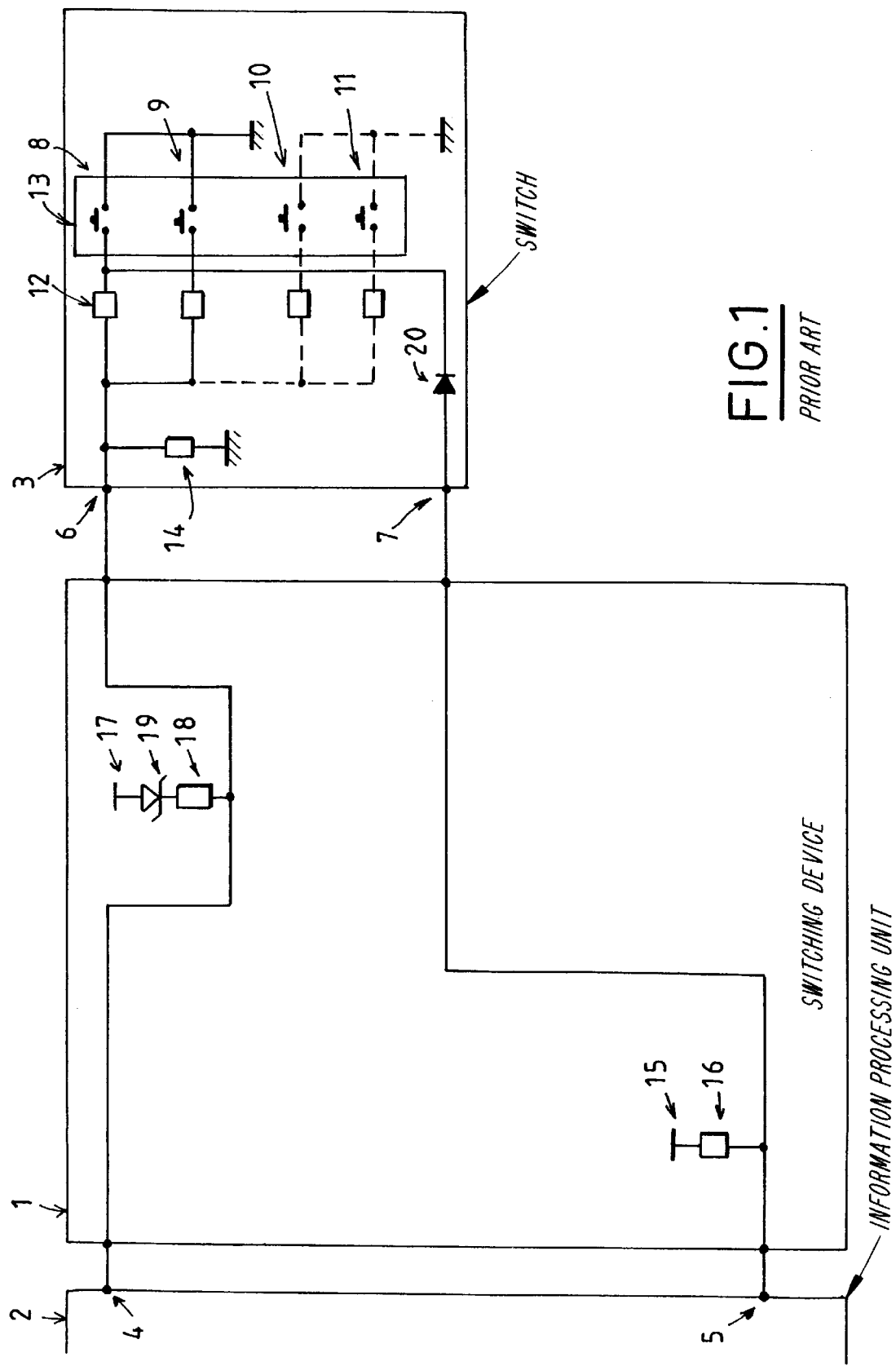
FIG. 1 represents an electrical diagram of an example embodiment of a switching device of the state of the art.

Thus, in FIG. 1 may be recognized a switching system which includes a device for switching between stand-by and wake-up states, and designated by the general reference 1 in this figure, interposed between an information processing unit designated by the general reference 2 and at least one analogue switch with voltage levels, designated by the general reference 3 in this figure.

In such a system, the information processing unit 2 includes an analogue information input designated by the general reference 4 in this figure and a wake-up information input designated by the general reference 5, originating from corresponding terminals 6 and 7 of the analogue switch 3.

Such a switch includes, for example, several circuits in parallel, four of which are designated by the general reference 8, 9, 10 and 11 in this figure, each including a resistor in series with a breaker, and which are interposed between the analogue information output 6 of the switch and earth.

Thus, for example, the circuit 8 includes a resistor 12 in series with a breaker 13 of the push-button type.

Moreover, a fault detection resistor, designated by the general reference 14, is joined between the analogue information output 6 of this switch and earth.

The wake-up information input 5 of the information processing unit 2 is also linked to a permanent voltage source 15 through a resistor 16, whilst the analogue information input 4 of the latter is linked to a controllable voltage source 17 by this information processing unit, through a resistor 18 and a diode 19.

A diode 20 is arranged in the circuit of the wake-up information input of the unit 2.

As indicated previously, in the stand-by state, the information processing unit 2 cuts off the controllable voltage source 17.

Additionally, this information processing unit monitors the logic level of its wake-up information input 5 which passes from a logic 1 state to a logic 0 state, in case of actuation for example of one of the breakers of the switch.

In this case, the central unit 2 triggers the operation of the controllable voltage source 17, so as to allow the forwarding of the analogue information from the switch 3 to the analogue information input 4 of this unit 2, so as to allow analysis of this information.

As indicated previously, this structure has a certain number of drawbacks and notably of low-current wake-up, of necessity for passive components such as resistors and active components such as diodes, like the diode 20 interposed in the circuit of the wake-up information input of the unit, to be integrated into the switch, of relatively large consumption in the stand-by state and of feeding of a permanent voltage level into the analogue information input of the central unit.

Figure 2:
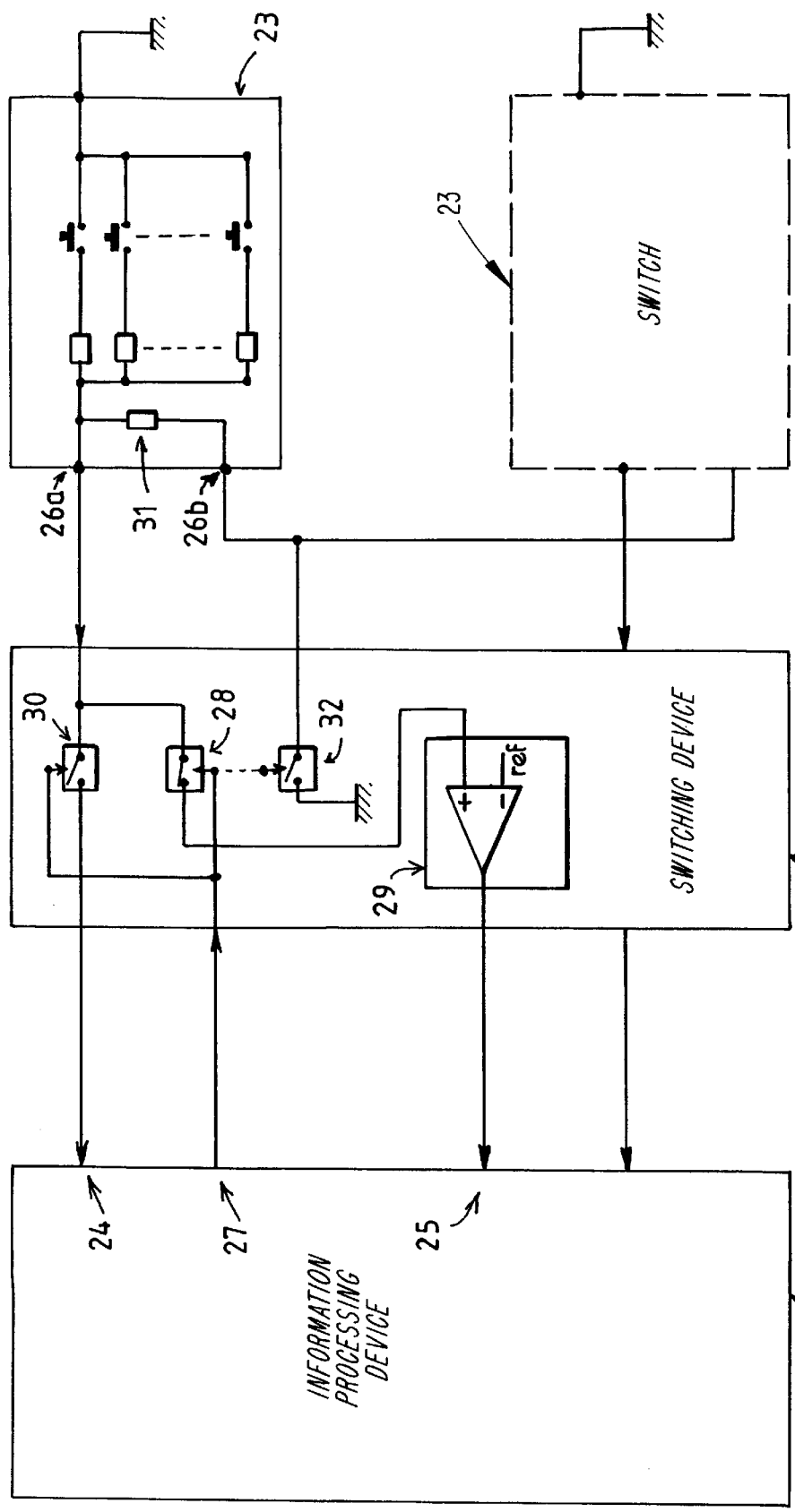
FIG. 2 represents a schematic diagram illustrating the structure of a switching device according to the invention.
Figure 3:
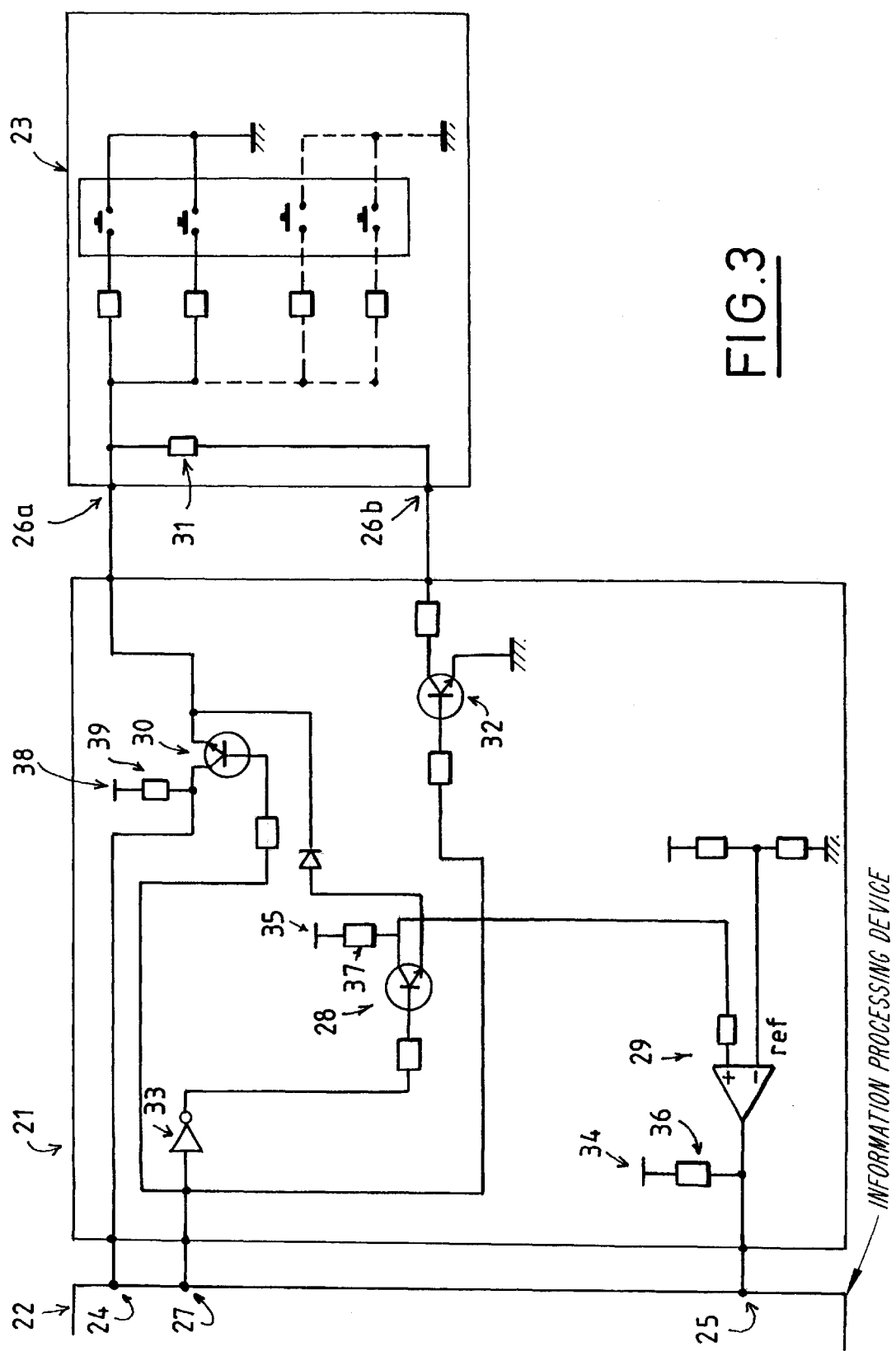
FIG. 3 represents an electrical diagram of such a switching device.

A switching system according to the invention has been represented in FIGS. 2 and 3.

In these figures may be recognized a switching device which is designated by the general reference 21 in these figures and which is interposed between a central information processing unit 22 and at least one switch 23, this switch being an analogue switch with voltage levels analogous to that described previously.

The information processing unit still includes an analogue information input designated by the general reference 24 and a wake-up information input, designated by the general reference 25 in this figure, it being possible for these inputs to be joined to corresponding terminals 26a and 26b of the switch 23.

The analogue switch 23 still includes, for example, several circuits in parallel, each furnished with a resistor and with a breaker or with a push-button, which are interposed between the analogue information output 26a of the switch and earth, so that it will not be described in greater detail hereafter.

According to the invention, the information processing unit 22 also includes a stand-by/wake-up state control output for the device, designated by the general reference 27 in these figures.

Moreover, the switching device 21 includes a first semiconductor switch facility openable by the state control output 27 of the central unit, and designated by the general reference 28 in these figures, which is interposed between the analogue output 26a of the switch and a voltage comparator 29, adapted so as to compare the analogue output signal from the switch with a reference level ref, so as to deliver a corresponding command at the wake-up information input 25 of the central unit.

Moreover, the switching device 21 includes a second semiconductor switch facility closeable by the state control output of the central unit designated by the general reference 27, this semiconductor switch facility being designated by the general reference 30 in these figures and being interposed between the analogue output 26a of the analogue switch 23 and the analogue information input 24 of the central unit 22.

The switch 23 also includes a fault detection resistor 31, one terminal of which is linked to the analogue output 26a of the switch and the other terminal of which is adapted so as to be linked to earth through a third semiconductor switch facility, closeable by the state control output 27 of the central unit and designated by the general reference 32 in these figures.

As may be seen in FIG. 3, these various semiconductor switch facilities can include, for example, NPN transistors, the transistor constituting the openable semiconductor switch facility 28 being associated with an inverter designated by the general reference 33 in this FIG. 3, interposed between its base and the state control output 27 of the central unit.

Finally, the wake-up information input 25 and the state control output 27 of the unit are linked to permanent voltage sources 34 and 35 respectively through resistors 36 and 37, whilst its analogue information input 24 is linked to a controllable voltage source 38 through a resistor 39, in conventional manner.

It may be appreciated that the operation of such a system is as follows.

In the stand-by state, the processing unit cuts off the voltage source 38 and the switching device 21 disconnects the or each switch from the corresponding analogue information input 24 of the central unit 22.

To this end, this central unit 22 delivers at its stand-by/wake-up state control output 27 a logic 0 level for driving the semiconductor switch facilities 28, 30 and 32.

In this case, the facilities 30 and 32 are open, whilst the semiconductor switch facility 28 is closed owing to the interposition of the inverter 33 between this output of the unit and the corresponding transistor.

Thus, the analogue output information originating from the switch 23 is disconnected from the central unit by the semiconductor switch facility 30, whilst the fault detection resistor 31 is not linked to earth owning to the opening of the semiconductor switch facility 32.

The analogue output information from the switch 23 is then directed to one of the terminals and for example the non-inverting terminal of the comparator 29 by the semiconductor switch facility 28 which is closed.

The reference level ref of the inverting input of this comparator 29 can be fixed so that it is lower than the input level on the other terminal of the latter if none of the breakers, for example, of the switch is activated.

In this case, the output of this comparator 29 remains at the logic 1 state, on stand-by.

Once an action is exercised at the level of the switch 23 and once, for example, one of its push-buttons or breakers is actuated, the comparator 29 sees the level of its non-inverting input become lower than that of its inverting input, so that it toggles its output to the logic 0 state.

This arises from the fact that for example the breakers of this switch are linked to earth.

This change of state of the output of the comparator 29 and therefore of the wake-up information input 25 of the central unit 22 is detected by the latter which wakes up the device by triggering operation of the source 38 and by toggling its stand-by/wake-up state control output 27.

A wake-up command is therefore sent by this output of the central unit to the device.

This command is received by the device so as to toggle its various semiconductor switch facilities, that is to say so as to open the switch facility 28 and close the switch facilities 30 and 32.

Thus, the analogue information arising from the switch 23, can flow through the semiconductor switch facility 30 heading for the analogue information input 24 of the central unit 22, whilst the semiconductor switch facility 32 connects the corresponding terminal of the fault detection resistor 31 to earth, thus making it possible to detect switch unplugged or short-circuit faults for example.

The transistors are, of course, associated with bias resistors in the conventional manner and the reference signal applied to the comparator can be obtained, for example, with the aid of a resistor bridge.

It is thus appreciated that such a device makes it possible to minimize the consumption of current in the stand-by state, by completely disconnecting the analogue switch(es) of the central unit, but while standing by to inform it of all wake-up requests by one of them.

It will be noted that the resistors of the parallel circuits of the switch are for example different so as to allow recognition of the analogue information, in the conventional manner.

The device according to the invention therefore has a certain number of advantages with respect to the devices of the state of the art, especially in regard to its modularity, its negligible consumption in the stand-by state, this consumption being independent of the number of added switches, the possibility of using several breakers or the like in a switch without adding further components into the switching device, of using only passive components in the switch, of allowing wake-up with a much larger current than in the state of the art, of selecting one or more breakers, for example switches, which will allow system wake-up by acting on the reference threshold applied to the inverting input of the comparator 29, and finally of requiring no modification of the number of wires connected between the central unit and the or each switch.

I claim:

1. System for switching between stand-by and wake-up states, including a switching device (21) interposed between an information processing unit (22) and at least one analogue switch with voltage levels (23), in which the information processing unit (22) includes an analogue information input (24) and a wake-up information input (25) originating from an analogue output of the analogue switch, wherein the information processing unit (22) furthermore includes a stand-by/wake-up state control output (27) for the device, this device including a first semiconductor switch facility (28) openable by the state control output of the central unit, and which is interposed between the analogue output of the switch and a voltage comparator (29) adapted so as to compare the analogue output signal from the switch with a reference level so as to deliver a corresponding command at the wake-up information input (25) of the central unit, and a second semiconductor switch facility (30) closeable by the state control output of the central unit, and which is interposed between the analogue output of the analogue switch and the analogue information input (24) of the central unit.

2. Device according to claim 1, wherein the analogue switch (23) includes a fault detection resistor (31), one terminal of which is joined to the analogue output of this switch and another terminal of which is adapted so as to be linked to earth through a third semiconductor switch facility (32) of the device, closeable by the stand-by/wake-up state control output (27) of the central unit (22).

3. Device according to claim 1, wherein the semiconductor switch facilities comprise transistors.

4. Device according to claim 3, wherein the transistor constituting the openable semiconductor switch facility (28) is associated with an inverter (33) interposed between its base and the state control output (27) of the central unit.

* * * * *

UNITED STATES PATENT AND TRADEMARK OFFICE
CERTIFICATE OF CORRECTION

PATENT NO. : 5,883,446
DATED : March 16, 1999
INVENTOR(S) : YUTH, Loth Siri

It is certified that error appears in the above-identified patent and that said Letters Patent is hereby corrected as shown below:

On the title page,
    item [30]  Foreign Application Priority Data

"Jun. 28, 1996    [FR]    France..........98 08123"

should read   --Jun. 28, 1996    [FR]    France..........96 08123--

Signed and Sealed this

Fourteenth Day of December, 1999

Attest:

Q. TODD DICKINSON

*Attesting Officer*        *Acting Commissioner of Patents and Trademarks*